United States Patent [19]

Yester, Jr. et al.

[11] Patent Number: 4,542,352
[45] Date of Patent: Sep. 17, 1985

[54] CAVITY OSCILLATOR WITH UNDESIRED MODE ABSORBING WAVEGUIDES FOR LINEAR FM

[75] Inventors: Francis R. Yester, Jr., Arlington Heights; Paul H. Gailus, Chicago; Edward V. Louis, Elgin, all of Ill.

[73] Assignee: Motorola, Inc., Schaumburg, Ill.

[21] Appl. No.: 505,568

[22] Filed: Jun. 17, 1983

[51] Int. Cl.$^4$ .................. H03B 5/18; H03B 7/14; H03C 3/08; H03C 3/20

[52] U.S. Cl. ..................... 331/96; 331/105; 331/107 DP; 331/117 D; 331/177 V; 332/18; 332/30 V

[58] Field of Search ............ 331/96, 97, 98, 101, 331/105, 107 DP, 107 C, 117 D, 177 V; 332/16 R, 18, 30 V

[56] References Cited

U.S. PATENT DOCUMENTS

| 3,704,429 | 11/1972 | Sigmon | 331/101 |
|---|---|---|---|
| 3,803,513 | 4/1974 | Oya et al. | 331/96 |
| 3,805,193 | 4/1974 | Mohr | 333/6 |
| 3,858,123 | 12/1974 | Ohta et al. | 331/107 |
| 3,883,822 | 5/1975 | Basset | 331/107 |
| 3,913,035 | 10/1975 | Havens | 331/107 |
| 3,919,666 | 11/1975 | Posner et al. | 331/96 |
| 3,982,211 | 9/1976 | Endersz | 332/30 |
| 4,238,747 | 12/1980 | Harp et al. | 331/96 X |
| 4,462,007 | 7/1984 | Shirai | 331/96 |

FOREIGN PATENT DOCUMENTS

| 0114008 | 9/1980 | Japan | 331/107 DP |
|---|---|---|---|
| 0114009 | 9/1980 | Japan | 331/107 DP |
| 0114007 | 9/1980 | Japan | 331/107 DP |

OTHER PUBLICATIONS

Ohta, T. et al., "New Self-Injection Oscillator Using Directional Filter" 1973 European Microwave Conference Brussels, Belgium; Sept. 4–7, vol. 1, 4 pp.

Linearity Improvement of Microwave FM Oscillators by Harmonic Tuning, Article written by Gyorgy G. Endersz for IEEE Transactions on Microwave Theory and Techniques, vol. MTT-23, No. 4, Apr., 1975, pp. 360–367.

Article on Study of the Harmonic Effects for Waveguide Gunn-Diode Oscillator Optimization by Ezio M. Bastida, Member, IEEE published in IEEE Transactions on Microwave Theory and Techniques, vol. MTT-28, No. 4, Apr., 1980—pp. 305–313.

Primary Examiner—Eugene R. LaRoche
Assistant Examiner—D. C. Mis
Attorney, Agent, or Firm—Charles L. Warren; Donald B. Southard

[57] ABSTRACT

A modulated elongate cavity oscillator with minimized modulation nonlinearities includes a first cavity having dimensions which determine the fundamental resonant frequency of the oscillator, a gain element disposed in said first cavity that provides amplification to sustain oscillation, and a varactor diode disposed in said first cavity for modulating the fundamental frequency. A first waveguide is coupled to the first cavity for absorbing modes higher than the mode of the fundamental frequency which have an electric field maxima concurrent with the longitudinal center line of the first cavity. A second waveguide is coupled to the first cavity for absorbing modes higher than the mode of fundamental frequency which have an electric field minima concurrent with the longitudinal center line of the first cavity, whereby the first and second waveguides provide effective attenuation of higher order modes such that modulation nonlinearities due to the existence of higher order modes are substantially eliminated.

35 Claims, 3 Drawing Figures

CAVITY OSCILLATOR WITH UNDESIRED MODE ABSORBING WAVEGUIDES FOR LINEAR FM

BACKGROUND OF THE INVENTION

This invention relates generally to modulated cavity oscillators and more specifically to means for minimizing modulation nonlinearities in a broad band cavity oscillator.

There are various types of known frequency modulated microwave cavity oscillators. A Gunn diode mounted within a cavity oscillator has been utilized to provide the necessary amplification to sustain oscillation. A varactor diode also mounted within the cavity can be used to vary the oscillator frequency under the control of an external voltage source thereby frequency modulating the oscillator.

Various types of microwave cavity oscillators are known wherein two coupled cavities are employed. In U.S. Pat. No. 3,803,513 two cavity resonators having different resonant frequencies are coupled together by means of hybrid circuit to provide stable operation relative to temperature variations. In order to achieve a low noise high power output as taught in U.S. Pat. No. 3,858,123, two wave guide sections are coupled together by a directional resonator.

Secondary cavities associated with a main cavity have also been utilized to provide certain desired characteristics. For example, in U.S. Pat. No. 3,913,035 a high-Q secondary cavity is connected to a primary low-Q cavity in order to enhance frequency stablization and eliminate noise associated with spurious signals. U.S. Pat. No. 3,883,822 discloses a load terminated auxillary cavity which is coupled to a main cavity which controls the wave mode and frequency in order to minimize the risk of parasitic oscillations. A secondary cavity terminated in an adjustable short has been used with a primary cavity to effect the tuning of harmonics; see Ezio M. Bastida "Study of Harmonic Effects for Waveguide Gunn—Diode Oscillator Optimization," *IEEE Transactions on Microwave Theory and Techniques*, Vol. MTT-28, No. 4 (April 1980), 305–313.

Modulation nonlinearities due to undesired higher order resonances in frequency modulated microwave cavity oscillators have presented a difficult problem. One technique used in attempting to solve this problem is to insert lossy ferrite materials inside the resonant cavity to de-Q undesired modes. However, such ferrites also tend to de-Q the fundamental, that is the desired, resonant frequency. Another technique that has been utilized to combat the modulation nonlinearity problem is to employ special tuning elements in the resonant cavity such that they effect the harmonic frequency more than the fundamental. Such tuning elements are adjusted to minimize the nonlinearity attributed to harmonics at a certain fundamental frequency. However, this technique has the objectional feature of requiring numerous adjustments for a given operating frequency and may require readjustments should the operating frequency be changed.

U.S. Pat. No. 3,982,211 to G. G. Endersz discloses a frequency modulated cavity oscillator having improved linearity. The improved linearity is achieved by a parallel resonant circuit tuned to a second harmonic of the fundamental frequency. This technique has the disadvantage of having to retune the circuit resonant at the second harmonic whenever the fundamental operating frequency is changed. This technique is also addressed in an article "Linearity Improvement of Microwave FM Oscillators by Haromonic Tuning" by G. G. Endersz in *IEEE Transactions on Microwave Theory and Techniques* Vol. MTT-23, No. 4 (April 1975), 360–367.

SUMMARY OF THE INVENTION

It is an object of the present invention to substantially eliminate modulation nonlinearities in a cavity oscillator.

A further object of this invention is to achieve such elimination of modulation nonlinearities over a substantial range of fundamental operating frequencies so that tuning adjustments are not required in order to maintain the modulation linearity characteristic.

An additional object is to substantially eliminate modulation nonlinearities without using lossy ferrite materials within the resonant cavity.

In the illustrative embodiment of the present invention, a polyhedral resonant cavity is disposed between and coupled to first and second cutoff waveguide means. One waveguide means includes a longitudinally centered conductive obstruction or wall which substantially reflects the fundamental mode while permitting higher order modes, especially those having electric field voltage minima concurrent with the wall, to propagate. This cut-off waveguide includes absorbing microwave loads disposed at the distal end of the cutoff waveguide on each side of the wall to absorb the propagated higher order modes. Preferably the other cutoff waveguide contains a longitudinally centered aperture designed to permit higher order modes, especially those having electric field voltage maxima concurrent with the aperture, to propagate therethrough. An absorbing microwave load is disposed at the distal end of this other waveguide to absorb such propagating modes. A semiconductor amplification device and its mounting structure are preferably disposed in the resonant cavity along the longitudinal center line.

BRIEF DESCRIPTION OF THE DRAWINGS

The drawings illustrate an exemplary embodiment of the present invention wherein the same reference numerals in different figures refer to like elements.

DETAILED DESCRIPTION

One focus of this invention is to substantially eliminate modulation nonlinearities in a cavity oscillator over the entire frequency range of the oscillator without requiring adjustments as the fundamental frequency is varied within the operating range. When a varactor diode is used to frequency modulate a cavity oscillator, the instantaneous frequency of the oscillator varies in relationship to the voltage applied to the varactor diode. Ideally, the oscillator frequency versus voltage applied to the varactor diode characteristic is a linear or straight line function. Thus, modulation linearity refers to a smooth linear change in frequency in response to changes in voltage applied to the varactor diode. Conversely, a modulation nonlinearity exists when one or more points in the characteristic curve have a substantial nonlinear variation, that is, the slope of the characteristic curve at the point of a nonlinearity changes substantially from that of the slope of the linear characteristic.

The cavity modes higher than the fundamental resonant mode of the cavity oscillator cause modulation nonlinearities. More specifically higher order modes which occur at or near the second harmonic of the fundamental frequency ($2f_o$) cause substantial modulation nonlinearities to occur. The embodiment of the present invention as described below substantially eliminates (i.e. minimizes) modulation nonlinearities due to second harmonic resonances over a substantial range of fundamental frequencies without tuning adjustments.

Figure 1:
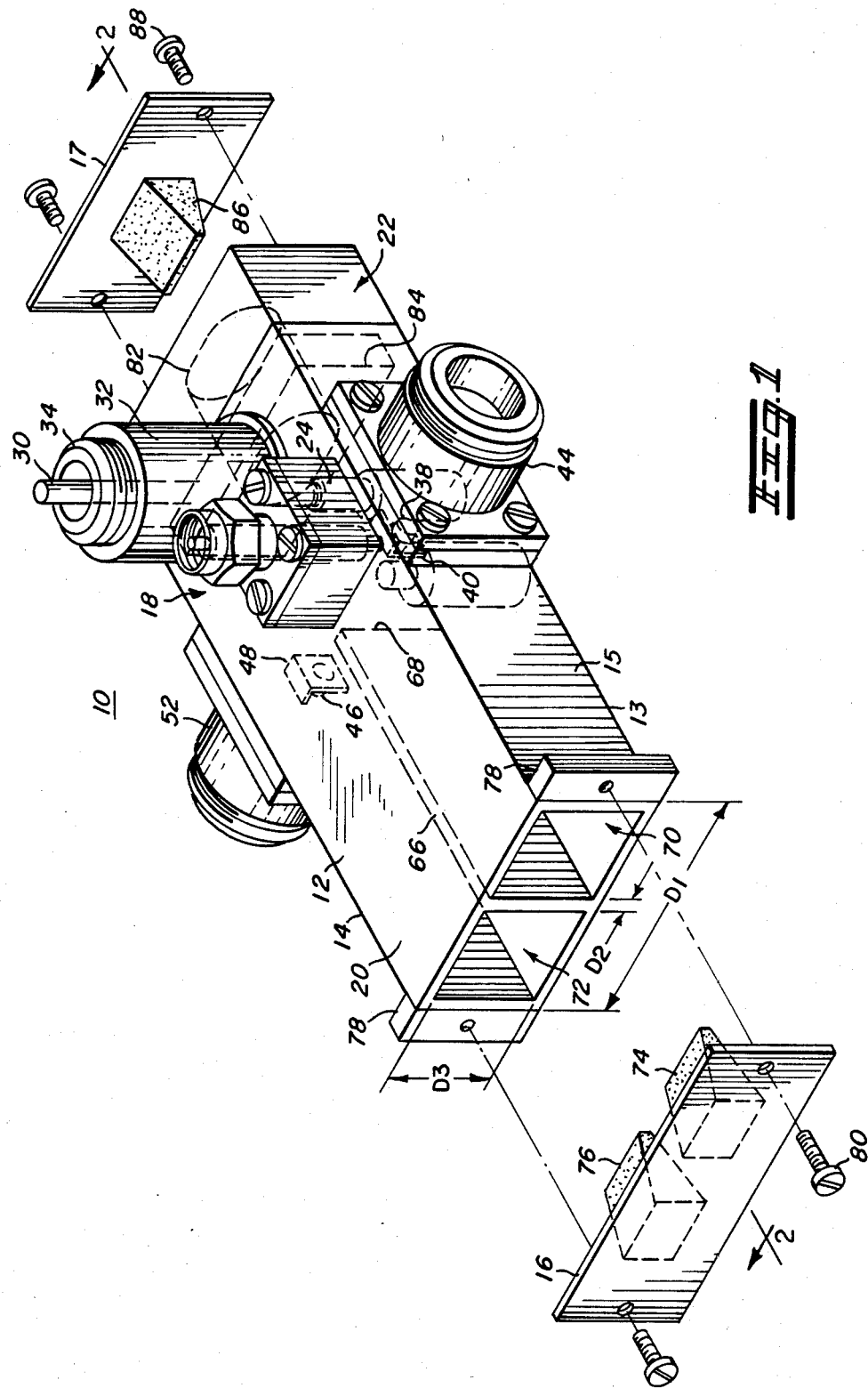
FIG. 1 is an isometric view of an embodiment of a cavity oscillator according to present invention wherein each end plate is shown removed.
Figure 2:
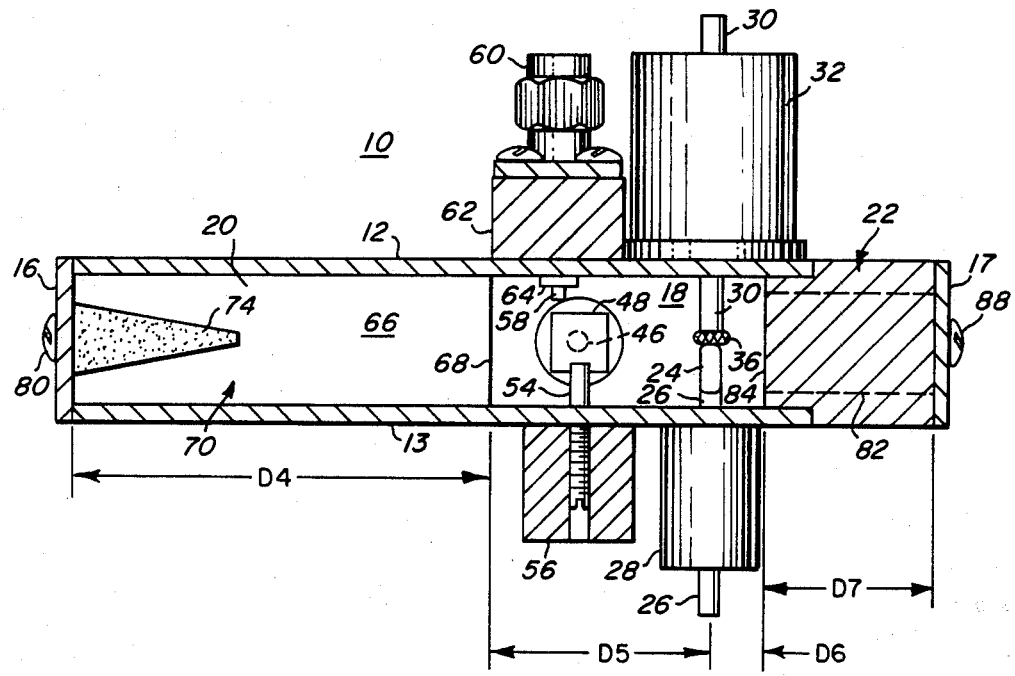
FIG. 2 is a longitudinal cross sectional view taken about line 2—2 of FIG. 1.
Figure 3:
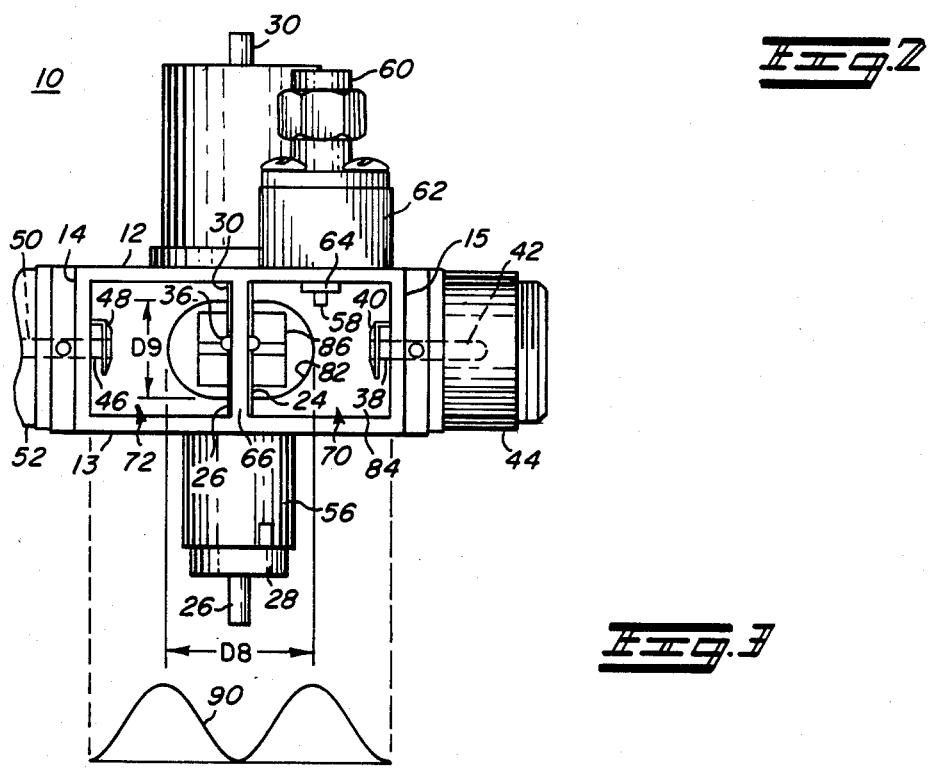
FIG. 3 is an elevational end view of the apparatus shown in FIG. 1 with a diagrammatic representation of an electric field waveform of a higher order mode.

Referring to FIGS. 1–3, a polyhedral frequency modulated cavity ocillator 10 includes planar sides 12, 13, 14, and 15 and is terminated by end plates 16 and 17. The oscillator includes a central cavity 18 which defines the fundamental resonant frequency and is disposed between a first cutoff waveguide section 20 and a second cutoff waveguide section 22. The oscillator may be generally fabricated from a suitable metal such as copper.

An amplification device 24 such as a Gunn diode is mounted within cavity 18 along the longitudinal center line of the oscillator and perpendicular to walls 12 and 13. One terminal of diode 24 is electrically connected to and supported by a threaded adjustable post 26 which is electrically connected to wall 13. Rod 26 is threadedly engaged with bushing 28 which is secured to wall 13. Another opposing post 30 is mounted to wall 12 by means of a bushing 32, a standoff insulating washer (not shown) and a captivating threaded slug 34 so as to be insulated with respect to wall 12. To the end of post 30 which projects into cavity 18 is mounted a resilient wire mesh 36 which deforms upon engagement with the other terminal of diode 24 to establish electrical connection with post 30. This mesh provides a means for establishing positive electrical connection with the diode without placing undue mechanical stress on same. The mesh also provides a convenient means for initially seating the diode in the proper position. For example, the diode may be first connected to post 26, screwed inwardly toward mesh 36 and secured once the other terminal of the diode engages and deforms the mesh. This provides a degree of flexibility with respect to mechanically mounting the diode. The distal end of post 30 is suited to be connected to an external source of DC voltage which supplies the proper bias to diode 24.

A varactor diode 38 or other controllable reactance varying means has one terminal connected to coupling loop 40 which is connected to wall 15 and the other terminal connected to pin 42 of a connector 44. An external source of modulating voltage is connected between pin 42 and wall 15 to induce frequency modulation about the fundamental resonance frequency. Another varactor diode 46 may be mounted opposite diode 38 to wall 14 by means of coupling loop 48 and connecting pin 50 of connector 52. This diode may be connected to an external voltage source to provide an automatic frequency control (AFC) which may be conventionally derived by using a feedback signal from the output of the oscillator. Both diodes 38 and 46 are preferably centered between walls 12 and 13.

The fundamental resonant frequency of cavity 18 can be varied by means of a dielectric rod 54 which is threadedly mounted to a bushing 56 so that the length of the rod projecting inwardly into cavity 18 can be controlled. This rod is preferably positioned along the longitudinal center line of oscillator 10 as is Gunn diode 24, to maintain symmetry in the cavity to minimize disruption of the higher order fields.

Output energy is coupled from cavity 18 by means of a voltage probe 58 which is connected to the center pin of a suitable coaxial connector 60 that is mounted to wall 12 by means of mount 62. Probe 58 which is surrounded by a dielectric material 64 extends through a hole in wall 12. Pin 58 extends perpendicular to wall 12 and is preferably positioned one-quarter of the distance between walls 14 and 15. This position minimizes disruption of the 2,0,X mode which has a current minima at this location, i.e. the mounting hole for the probe does not disturb the higher order mode current path. It is desirable that disturbance of the fields of the higher order modes, especially those occurring at or near the second harmonic of the fundamental frequency be minimized so that propagation of same through waveguides 20 and 22 is maximized.

The first cutoff waveguide 20 includes a conductive obstruction 66 such as a wall extending between walls 12 and 13, and is concurrent with the center line of cavity 18. Waveguide 20 is cutoff or does not substantially propagate the fundamental mode but does propagate higher order modes. The end 68 of this wall defines the end of the cutoff waveguide 20 and one boundary of cavity 18. Wall 66 effectively divides waveguide 20 into parallel waveguides 70 and 72 which are terminated in absorbing microwave loads 74 and 76 respectively. These loads are mounted to end plate 16 which is secured to mounting tabs 78 by means of screws 80 and serve to absorb the propagated modes.

Waveguide 22 has a cutoff frequency higher than the highest fundamental resonant frequency over which cavity 18 is operable. In the illustrated embodiment, waveguide 22 is made from a solid piece of conductive material such as copper and has a centered oval aperture 82 which is symmetrical with respect to the longitudinal center line of oscillator 10. It will be apparent to those skilled in the art that the dimensions of this aperture define the cutoff frequency. Planar wall 84 defines the end of waveguide 22 and provides a boundary for cavity 18. A microwave load 86 mounted to plate 17 projects into aperture 82 to absorb waves that propagate therein. Plate 17 is secured by means of screws 88 which are received by threaded holes formed within the distal face of waveguide 22.

FIG. 3 illustrates a representative waveform 90 of the magnitude of an electric field associated with a 2,0,X mode. For a fundamental mode of 1,0,1, the 2,0,X mode may cause a substantial modulation nonlinearity. It will be apparent that the represented field has peaks or maxima at one-quarter and three-quarters of the width of the cavity, and has a null or minima at the longitudinal center line of the cavity. Waveguide 20 is especially adapted to permit the propagation of modes having voltage minima concurrent with wall 66 by means of parallal waveguides 70 and 72 such that these modes are absorbed by the loads 74 and 76. Wall 66 does not cause any substantial reflection of such modes. However, wall 66 will cause a substantial reflection of the fundamental resonance mode (1,0,1) since it will have an electric field maximum concurrent therewith. Thus, there is no substantial propagation of the fundamental mode by means of waveguides 70 and 72.

Waveguide 22 in contrast to waveguide 20 has a centered aperture 82 surrounded by substantial areas of conducting wall 84. Although the aperture is dimensioned to permit the propagation of modes higher than the fundamental resonant mode, a 2,0,X mode will not propagate as freely in waveguide 22 as in waveguide 20. This occurs since substantial magnitudes of the electric field occur outside the area defined by the aperture and thus a significant reflection of such modes occurs. Waveguides 20 and 22 cooperate to permit the effective propagation and termination of higher order modes which have both electric field minima and maxima along the center line of cavity 18.

Cavity oscillators exemplary of the present invention have been constructed and tested with respect to modulation nonlinearities. These units operated in the frequency range of 6.4 to 7.1 GHz. The aperture 82 of waveguide 22 was dimensioned to provide a cutoff frequency of approximately 10 GHz. Dimensions D1-D9 (in millimeters) as referenced in the drawings are as follows:

| | |
|---|---|
| D1 | 31.49 |
| D2 | 2.03 |
| D3 | 14.73 |
| D4 | 31.75 |
| D5 | 23.11 |
| D6 | 5.33 |
| D7 | 17.70 |
| D8 | 15.24 |
| D9 | 5.08 |

The radii for aperture 82 are 5.08 mm. Slope changes in the frequency versus varactor voltage characteristic curve over 30 MHz excursions did not exceed 1.0%. No narrow band modulation nonlinearities such as might be caused by higher order modes were observed.

It is believed that the present invention advances the modulated cavity oscillator field by substantially eliminating modulation nonlinearities due to higher order modes. It is significant that this result has been achieved over a substantial range of fundamental operating frequencies without the need of tuning adjustments to maximize higher order mode suppression; that is, the suppression of such modes is independent of the selected fundamental frequency.

Although an embodiment of this invention has been described and shown in the drawings, the scope of the present invention is defined and the claims appended hereto.

What is claimed is:

1. A modulated elongate cavity oscillator having minimized modulation nonlinearities comprising:
   a first cavity having dimensions which determine the fundamental resonant frequency of the oscillator;
   a gain element disposed in said first cavity that provides amplification to sustain oscillation;
   reactance means disposed in said first cavity for modulating the fundamental frequency;
   a first waveguide means contiguously coupled to said first cavity for absorbing modes higher than the mode of said fundamental frequency which have an electric field maxima concurrent with the longitudinal center line of said first cavity; and
   a second waveguide means contiguously coupled to said first cavity for absorbing modes higher than the mode of said fundamental frequency which have an electric field minima concurrent with the longitudinal center line of said first cavity, said first and second waveguide means providing effective attenuation of the higher order modes such that modulation nonlinearities due to the existence of higher order modes are substantially eliminated.

2. The oscillator according to claim 1 wherein said first waveguide means includes a first waveguide having a centered aperture which provides coupling from said first cavity thereto.

3. The oscillator according to claim 2 wherein said first waveguide means includes an absorbing load which terminates said first waveguide and absorbs the higher order modes which propagate therethrough.

4. The oscillator according to claim 1 wherein said reactance means comprises a varactor diode.

5. The oscillator according to claim 1 wherein said second waveguide means includes a second and third waveguide contiguous to each other, and absorbing loads which terminate said second and third waveguides to absorb propagated higher order modes.

6. The oscillator according to claim 1 wherein said second waveguide means includes a metal wall which bisects same longitudinally to define contiguous parallel second and third waveguides dimensioned to propagate the higher order modes having electric field minima at said wall.

7. The oscillator according to claim 1 wherein said first cavity is an elongate polyhedron and said first waveguide means defines one end of said elongate polyhedron and said second waveguide means defines the other end of said elongate polyhedron.

8. The oscillator according to claim 6 wherein said metal wall and said gain element are disposed on the longitudinal center line of said first cavity and lie in a common plane.

9. The oscillator according to claim 6 wherein said reactance means is mounted to a first peripheral wall that is parallel to said metal wall.

10. The oscillator according to claim 9 further comprising another reactance means disposed on a second peripheral wall opposite said first wall for varying the fundamental resonant frequency of said first cavity to effect automatic frequency control.

11. The oscillator according to claim 1 further comprising an output coupling means disposed in said first cavity for coupling energy from said first cavity.

12. The oscillator according to claim 11 wherein said output coupling means is a voltage coupling element that is located at a current null for the second harmonic mode of the fundamental frequency to minimize disruption of the second harmonic mode field.

13. The oscillator according to claim 1 further comprising a means for tuning said first cavity over a substantial range of fundamental frequencies, said first and second waveguide means effectively attenuating higher order modes independent of the fundamental frequency within said range.

14. The oscillator according to claim 13 wherein said tuning means comprises a dielectric rod and means for adjustably positioning it within said first cavity.

15. The oscillator according to claim 14 wherein said dielectric rod is disposed along the longitudinal center line of said first cavity to maintain symmetry so as not to disturb the higher order mode fields.

16. A method for minimizing modulation nonlinearities in a modulated cavity oscillator having a first cavity with dimensions which determine the fundamental resonant frequency, a gain element in the first cavity to sustain oscillation, and a reactance means in the first cavity for modulating the fundamental frequency, said method comprising the steps of:

directly coupling modes present in the first cavity which are higher than the fundamental resonant frequency and which have electric field maxima at a center line of said first cavity to an absorbing load; and directly coupling other higher order modes present in the first cavity which have electric field minima at the centerline of the first cavity to another absorbing load, whereby higher order modes are sufficiently minimized to substantially eliminate modulation nonlinearities due to higher order modes.

17. The method according to claim 16 further comprising the step of tuning the first cavity to a given fundamental resonant frequency within a range of frequencies over which the first cavity is operable, the absorption of said higher order modes being sufficient to substantially eliminate modulation nonlinearities independent of the given fundamental frequency in said range.

18. A cavity oscillator operable over a range of frequencies and having substantially attenuated modes higher than the mode of the fundamental resonant frequency comprising:

a waveguide section having dimensions which determine the fundamental resonant frequency of the oscillator;

a gain element disposed in said section to provide amplification to sustain oscillation;

a first waveguide means contiguously coupled to said section for propagating higher order modes having an electric field maxima at the center of said section;

a second waveguide means contiguously coupled to said section for propagating higher order modes having an electric field minima at the center of said section; and absorbing loads disposed in said first and second waveguide means to absorb propagated modes, whereby higher order modes with electric field minima and maxima at the center of said section are effectively attenuated.

19. The oscillator according to claim 18 wherein said first waveguide means comprises a first waveguide with a central aperture for propagating the higher order modes.

20. The oscillator according to claim 18 wherein said second waveguide means comprises a second waveguide having a reflective obstruction at its center line, and second and third apertures on each side of said obstruction for propagating said higher order modes, said obstruction concurrent with said electric field minima.

21. The oscillator according to claim 18 further comprising a means within said section for frequency modulating said fundamental frequency, whereby nonlinearities due to higher order modes are substantially eliminated.

22. The oscillator according to claim 18 wherein said first and second waveguide means each permit their respective higher order modes to propagate over a range of frequencies corresponding to said range of fundamental frequencies such that the respective higher order modes are absorbed and attenuated independent of the selected fundamental resonant frequency.

23. The oscillator according to claim 18 further comprising means for resiliently mounting said gain element within said section, said mounting means including a wire mesh that deforms upon engagement of gain element to hold the latter and establish electric contact therewith.

24. The oscillator according to claim 18 wherein said waveguide section has a rectangular cross section.

25. A modulated elongate cavity oscillator having minimized modulation nonlinearities comprising:

a first cavity having dimensions which determine the fundamental resonant frequency of the oscillator;

means disposed in said first cavity for providing amplification to sustain oscillation and for modulating the fundamental frequency;

a first waveguide means coupled to said first cavity for absorbing modes higher than the mode of said fundamental frequency which have an electric field maxima concurrent with the longitudinal center line of said first cavity; and a second waveguide means coupled to said first cavity for absorbing modes higher than the mode of said fundamental frequency which have an electric field minima concurrent with the longitudinal center line of said first cavity, said second waveguide means including a second and third waveguide contiguous to each other, and absorbing loads which terminate said second and third waveguides to absorb propagated higher order modes, said first and second waveguide means providing effective attenuation of the higher order modes such that modulation nonlinearities due to the existence of higher order modes are substantially eliminated.

26. The oscillator according to claim 25 wherein said second waveguide means includes a metal wall which bisects same longitudinally to define contiguous parallel second and third waveguides dimensioned to propagate the higher order modes having electric field minima at said wall.

27. The oscillator according to claim 26 wherein said metal wall and said means for providing amplification are disposed on the longitudinal center line of said first cavity and lie in a common plane.

28. The oscillator according to claim 28 wherein said modulating means is mounted to a first peripheral wall that is parallel to said metal wall.

29. The oscillator according to claim 28 further comprising another modulating means disposed on a second peripheral wall opposite said first wall for varying the fundamental resonant frequency of said first cavity to effect automatic frequency control.

30. A cavity oscillator operable over a range of frequencies and having substantially attenuated modes higher than the mode of the fundamental resonant frequency comprising:

a waveguide section having dimensions which determine the fundamental resonant frequency of the oscillator;

a gain element disposed in said section to provide amplification to sustain oscillation;

a first waveguide means coupled to said section for propagating higher order modes having an electric field maxima at the center of said section;

a second waveguide means coupled to said section for propagating higher order modes having an electric field minima at the center of said section, said second waveguide means comprising a second waveguide having a reflective obstruction at its center line, and second and third apertures on each side of said obstruction for propagating said higher order modes, said obstruction concurrent with said electric field minima; and absorbing loads disposed in said first and second waveguide means to absorb propagated modes, whereby higher order modes with electric field minima and maxima at the center of said section are effectively attenuated.

31. The oscillator according to claim 30 wherein said first waveguide means comprises a first waveguide with a central aperture for propagating the higher order modes.

32. The oscillator according to claim 30 further comprising a controllable reactive element within said section for frequency modulating said fundamental frequency, whereby nonlinearities due to higher order modes are substantially eliminated.

33. The oscillator according to claim 30 wherein said first and second waveguide means each permit their respective higher order modes to propagate over a range of frequencies corresponding to said range of fundamental frequencies such that the respective higher order modes are absorbed and attenuated independent of the selected fundamental resonant frequency.

34. The oscillator according to claim 30 further comprising means for resiliently mounting said gain element within said section, said mounting means including a wire mesh that deforms upon engagement of gain element to hold the latter and establish electric contact therewith.

35. The oscillator according to claim 30 wherein said waveguide section has a rectangular cross section.

* * * * *

UNITED STATES PATENT AND TRADEMARK OFFICE
CERTIFICATE OF CORRECTION

PATENT NO.   :   4,542,352

DATED        :   September 17, 1985

INVENTOR(S)  :   Yester, Jr. et al.

It is certified that error appears in the above-identified patent and that said Letters Patent is hereby corrected as shown below:

In column 8, line 44, after the word claim, delete "28" and insert --26--.

Signed and Sealed this

Twenty-third Day of September 1986

[SEAL]

Attest:

DONALD J. QUIGG

Attesting Officer

Commissioner of Patents and Trademarks